(12) United States Patent
Nelson

(10) Patent No.: US 12,080,809 B2
(45) Date of Patent: Sep. 3, 2024

(54) METAL-OXIDE-SEMICONDUCTOR CAPACITOR AND CIRCUIT BOARD INCLUDING THE SAME EMBEDDED THEREIN

(71) Applicant: KYOCERA AVX Components Corporation, Fountain Inn, SC (US)

(72) Inventor: Cory Nelson, Simpsonville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

(21) Appl. No.: 17/722,465

(22) Filed: Apr. 18, 2022

(65) Prior Publication Data

US 2022/0352391 A1 Nov. 3, 2022

Related U.S. Application Data

(60) Provisional application No. 63/224,030, filed on Jul. 21, 2021, provisional application No. 63/183,114, filed on May 3, 2021.

(51) Int. Cl.
*H01L 29/94* (2006.01)
*H01L 29/66* (2006.01)

(52) U.S. Cl.
CPC ........ *H01L 29/94* (2013.01); *H01L 29/66181* (2013.01)

(58) Field of Classification Search
CPC ........ H01L 29/66181; H01L 29/92–94; H01G 4/33; H01G 4/40; H05K 1/0231
See application file for complete search history.

(56) References Cited

U.S. PATENT DOCUMENTS

| 7,036,680 B1 | 4/2006 | Baniecki et al. |
| 7,176,510 B2 | 2/2007 | Taki et al. |
| 7,371,651 B2 | 5/2008 | Won |
| 8,538,368 B1 * | 9/2013 | Campbell ............ H04B 1/1027 455/333 |
| 9,831,039 B2 | 11/2017 | Namikawa et al. |
| 11,101,072 B2 | 8/2021 | Harada et al. |
| 2005/0142733 A1 * | 6/2005 | Kurihara ............. H01L 27/0805 257/E27.048 |

(Continued)

OTHER PUBLICATIONS

International Search Report and Written Opinion for PCT/US2022/025180 dated Aug. 5, 2022, 8 pages.

*Primary Examiner* — Wasiul Haider
(74) *Attorney, Agent, or Firm* — Dority & Manning, P.A.

(57) ABSTRACT

A metal-oxide-semiconductor (MOS) capacitor can include a substrate including a semiconductor material, an oxide layer formed on a surface of the substrate, a conductive layer formed over at least a portion of the oxide layer, a first terminal connected with the surface of the substrate, and a second terminal connected with the conductive layer. The oxide layer can be connected in series between the substrate and the conductive layer to form a capacitor between the first terminal and the second terminal. Each of the first terminal and the second terminal can be exposed along the surface of the substrate for surface mounting the capacitor. The MOS capacitor can exhibit excellent high frequency performance. For example, an insertion loss of the MOS capacitor can be greater than about −0.75 dB for frequencies ranging from about 5 GHz to about 40 GHz.

19 Claims, 6 Drawing Sheets

(56) References Cited

U.S. PATENT DOCUMENTS

2012/0281336 A1* 11/2012 Marino .................. H01L 29/94
  29/25.42
2021/0193692 A1* 6/2021 Lim .................... H01L 27/1203
2022/0376036 A1* 11/2022 Matsubara ............. H01G 4/252

* cited by examiner

METAL-OXIDE-SEMICONDUCTOR CAPACITOR AND CIRCUIT BOARD INCLUDING THE SAME EMBEDDED THEREIN

CROSS REFERENCE TO RELATED APPLICATIONS

The present application claims filing benefit of U.S. Provisional Patent Application Ser. No. 63/183,114 having a filing date of May 3, 2021, and U.S. Provisional Patent Application Ser. No. 63/224,030 having a filing date of Jul. 21, 2021, both of which are incorporated herein by reference in their entirety.

BACKGROUND OF THE INVENTION

Metal-oxide-semiconductor (MOS) capacitors provide a variety of benefits, such as temperature stability, generally high breakdown voltages, and low leakage currents. MOS capacitors however, generally, have poor high frequency performance. For example, MOS capacitors generally employ terminations that require wirebond connections.

SUMMARY OF THE INVENTION

In accordance with one embodiment of the present disclosure, a capacitor can include a substrate including a semiconductor material, an oxide layer formed on a surface of the substrate, a conductive layer formed over at least a portion of the oxide layer, a first terminal connected with the surface of the substrate, and a second terminal connected with the conductive layer. The oxide layer can be connected in series between the substrate and the conductive layer to form a capacitor between the first terminal and the second terminal. Each of the first terminal and the second terminal can be exposed along the surface of the substrate for surface mounting the capacitor.

In accordance with another embodiment of the present disclosure, a capacitor can include a substrate including a semiconductor material, an oxide layer formed on a surface of the substrate, a conductive layer formed over at least a portion of the oxide layer, a first terminal connected with the surface of the substrate, and a second terminal connected with the conductive layer. The oxide layer can be connected in series between the substrate and the conductive layer to form a capacitor between the first terminal and the second terminal. The capacitor can exhibit an insertion loss at the second terminal and for an input signal applied to the first terminal. The insertion loss is greater than about −0.75 dB for frequencies ranging from about 5 GHz to about 40 GHz.

In accordance with another embodiment of the present disclosure, a method of forming a capacitor can include forming an oxide layer on a surface of a substrate comprising a semiconductor material; depositing a conductive layer over at least a portion of the oxide layer; depositing a first terminal on the surface of the substrate such that the first terminal is exposed along the surface of the substrate for surface mounting the capacitor; and depositing a second terminal on the conductive layer such that the second terminal is exposed along the surface of the substrate for surface mounting the capacitor.

In accordance with another embodiment of the present disclosure, a circuit board can include a circuit board substrate having a mounting surface, and a capacitor at least partially embedded within the circuit board substrate. The capacitor can include a substrate comprising a semiconductor material, an oxide layer formed on a surface of the substrate, a conductive layer formed over at least a portion of the oxide layer, a first terminal connected with the surface of the substrate, and a second terminal connected with the conductive layer. The oxide layer can be connected in series between the substrate and the conductive layer to form a capacitor between the first terminal and the second terminal. At least one via may be connected with the one of the first terminal or the second terminal. The via(s) may extend towards the mounting surface of the circuit board substrate.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which.

Figure 1A:
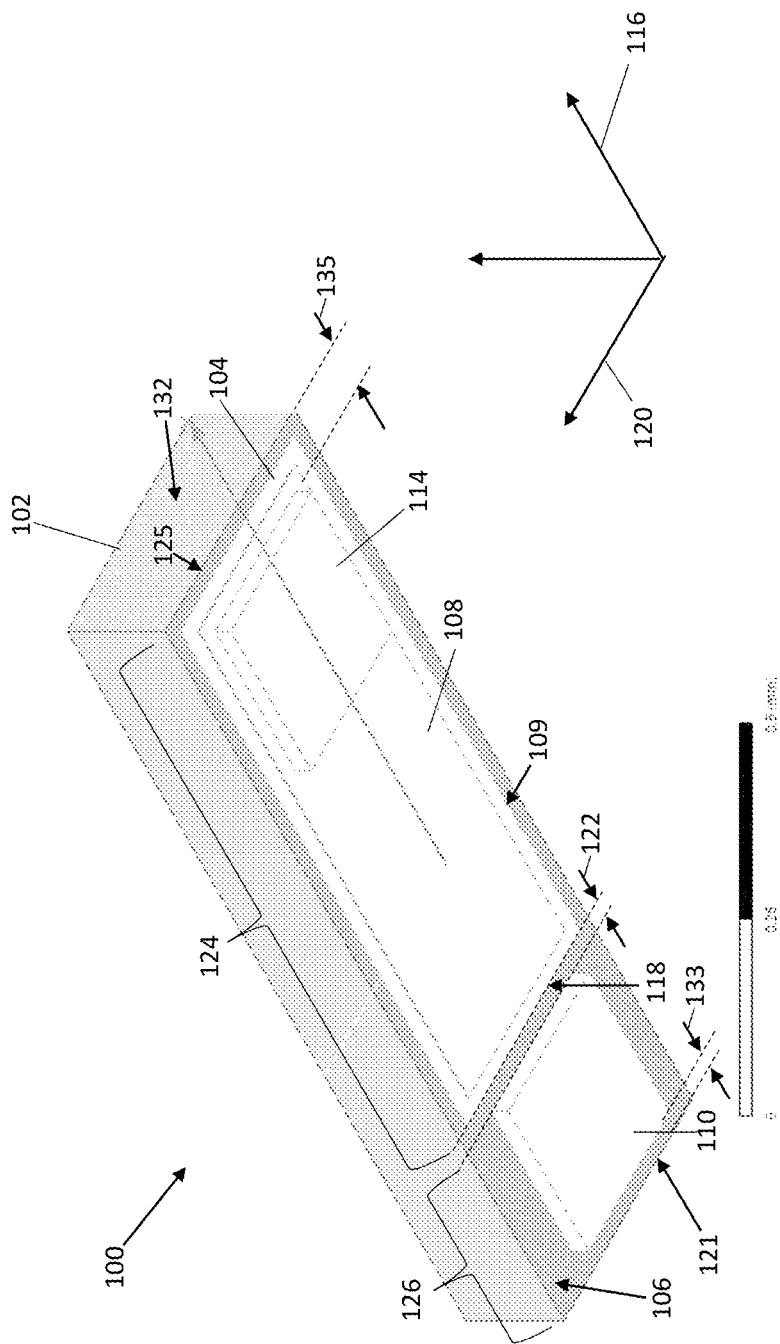
FIG. 1A is a perspective view of a capacitor according to aspects the present disclosure.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a metal-oxide-semiconductor (MOS) capacitor configured for surface mounting. The MOS capacitor can be free of electrical connections that cause high frequency perturbations and adversely affect high frequency performance. Examples of such electrical connections include wirebond connections.

As examples, the MOS capacitor can generally have excellent high frequency performance. For example, the MOS capacitor can exhibit an insertion loss that is greater than about −0.75 dB for frequencies ranging from about 5 GHz to about 40 GHz, in some embodiments greater than about −0.6 dB, in some embodiments greater than about −0.50 dB, and in some embodiments greater than about −0.40 dB.

As further examples, the MOS capacitor can exhibit an insertion loss that is greater than −1.15 dB for frequencies ranging from about 5 GHz to about 50 GHz, in some embodiments greater than about −1.0 dB, in some embodiments greater than about −0.75 dB, and in some embodiments greater than about −0.5 dB.

As further examples, the MOS capacitor can exhibit an insertion loss that is greater than −2.0 dB for frequencies ranging from about 5 GHz to about 60 GHz, in some embodiments greater than about −1.5 dB, in some embodiments greater than about −1.0 dB, and in some embodiments greater than about −0.75 dB.

The MOS capacitor can include a substrate including a semiconductor material, such as silicon, gallium arsenide, germanium, silicon carbide, strontium titanate, and/or mixtures thereof. The substrate can be doped with one or more suitable dopants, such as boron, arsenic, phosphorus, gallium, aluminum, indium, and antimony.

The capacitor can include an oxide layer formed on a surface of the substrate. The oxide layer can be or include silicon oxide and/or oxides of other example semiconductor materials described herein. The oxide layer can be grown in situ on the substrate. Lithography (e.g., photolithography) techniques can be used to define the shape of the oxide layer. For instance, portions of the oxide layer can be removed through etching such that the oxide layer is shaped as desired.

The surface of the substrate can generally be smooth. For example, the surface of the substrate can be free of pores, trenches, or the like. The oxide layer can have a generally uniform thickness on the surface of the oxide layer. For example, the thickness of the oxide layer can vary less than 20% across the oxide layer, in some embodiments less than 10%, and in some embodiments less than 5%.

The capacitor can include a conductive layer formed over at least a portion of the oxide layer. The conductive layer can be contained within a perimeter of the oxide layer. The conductive layer can be free of direct contact and/or direct electrical connection with the substrate. The conductive layer can be or include metal, such as aluminum, copper, gold, silver, nickel, or mixtures thereof.

One or more protective layers can be formed over the surface of the substrate. The terminals can be exposed through the protective layers for electrical connection when surface mounting the capacitor. Examples materials for the protective layer include benzocyclobutene (BCB), polyimide, silicon oxynitride, $Al_2O_3$, $SiO_2$, $Si_3N_4$, epoxy, glass, or another suitable material.

Various thin-film techniques can be used to form thin-film layers, such as the conductive layer, terminals, or the like. Examples of such techniques that may be employed include chemical deposition (e.g., chemical vapor deposition), physical deposition (e.g., sputtering), or any other suitable deposition technique for forming thin-film elements. Additional examples include any suitable patterning technique (e.g., photolithography), etching, and any other suitable subtractive technique for forming thin-film elements.

The thin-film layers can have a range of thicknesses. For example, the thin-film layers can have thicknesses that can range from about 0.0375 micrometers (microns) to about 40 microns, in some embodiments from about 0.1 microns to about 30 microns, in some embodiments from about 0.2 microns to about 20 microns in some embodiments from about 0.4 microns to about 10 microns.

The capacitor can include a first terminal connected with the surface of the substrate. A second terminal can be connected with the conductive layer. As used herein "connected with" can refer to components that are in direct physical contact. "Connected with" can also refer to items that are physically connected by one or more intermediate conductive layers such that the items are in direct electrical connection (e.g., without a resistive layer or dielectric layer therebetween). The first terminal can be formed over the surface of the substrate. The second terminal can be formed over the conductive layer.

Each of the first terminal and the second terminal can be exposed along the surface of the substrate for surface mounting the capacitor. For example, the capacitor can be configured for grid-array type mounting, such as land grid array, ball grid array, or the like.

The terminals can be connected and arranged such that the oxide layer cover less than all of the surface of the substrate. For example, the first terminal can be spaced apart from the second terminal in a Y-direction. An edge of the oxide layer can be aligned with an X-direction that is perpendicular to the Y-direction. An edge of the oxide layer can be spaced apart from an end of the substrate in the Y-direction.

The first terminal can be connected with the surface of the substrate at a location that is spaced apart from the oxide layer along the surface of the substrate. For example, the first terminal can be located between the edge of the oxide layer 104 and the end of the substrate. The edge of the oxide layer can be spaced apart from the first terminal by a distance that is greater than about 2 microns, in some embodiments greater than about 5 microns, in some embodiments greater than about 10 microns, and in some embodiments greater than about 15 microns.

The oxide layer can cover a first portion of the surface of the substrate that is distinct from a second portion of the surface of the substrate that is free of the oxide layer. The first terminal can be connected with the surface of the substrate within the second portion of the surface of the substrate. The first terminal can include an electrically conductive material that directly contacts the surface of the substrate.

The capacitor can be configured for grid array type mounting, such as ball grid array type mounting or land grid array type mounting. The terminals can be exposed along the surface and contained within a perimeter of the surface of the monolithic substrate. As another example, the substrate can have a pair of end surfaces that are perpendicular to the surface of the monolithic substrate. The pair of end surfaces can be free of terminations, including the terminals. As a further example, the first terminal, the second terminal layer, or both can be spaced apart from the pair of opposite end edges of the surface of the monolithic substrate by respective distances. The distances can be 10 microns or greater, in some embodiments 15 microns or greater, in some embodiments 20 microns or greater, in some embodiments 40 microns or greater, and in some embodiments 50 microns or greater.

FIG. 1A is a perspective view of a capacitor 100 according to aspects the present disclosure. The capacitor 100 can include a substrate 102 including a semiconductor material, such as silicon. The capacitor 100 can included an oxide layer 104 formed on a surface 106 of the substrate 102. The capacitor 100 can include a conductive layer 108 formed over at least a portion of the oxide layer 104. The conductive layer 108 can be contained within a perimeter 109 of the oxide layer 104. The conductive layer 108 can be free of direct contact and/or direct electrical connection with the substrate 102.

A first terminal 110 can be connected with the surface 106 of the substrate 102. A second terminal 114 can be connected with the conductive layer 108. Each of the first terminal 110 and the second terminal 114 can be exposed along the surface 106 of the substrate 102 for surface mounting the capacitor 102. The first terminal 110 can be co-planar with the oxide layer 104. For example, each of the first terminal 110 and the oxide layer 104 can be formed exclusively on the surface 106 of the substrate 102.

The first terminal 110 can be spaced apart from the second terminal 114 in a Y-direction 116. An edge 118 of the oxide layer 104 can be aligned with an X-direction 120 that is perpendicular to the Y-direction 116. An edge 118 of the oxide layer 104 can be spaced apart from an end 121 of the substrate 102 in the Y-direction 116.

The first terminal 100 can be connected with the surface 106 of the substrate 102 at a location that is spaced apart from the oxide layer 104 along the surface 106 of the substrate 102. For example, the first terminal 100 can be located between the edge 118 of the oxide layer 104 and the end 121 of the substrate 102. The edge 118 of the oxide layer 104 can be spaced apart from the first terminal 110 by a distance 122. In some embodiments, the distance 122 can be greater than about 2 microns.

Figure 1B:
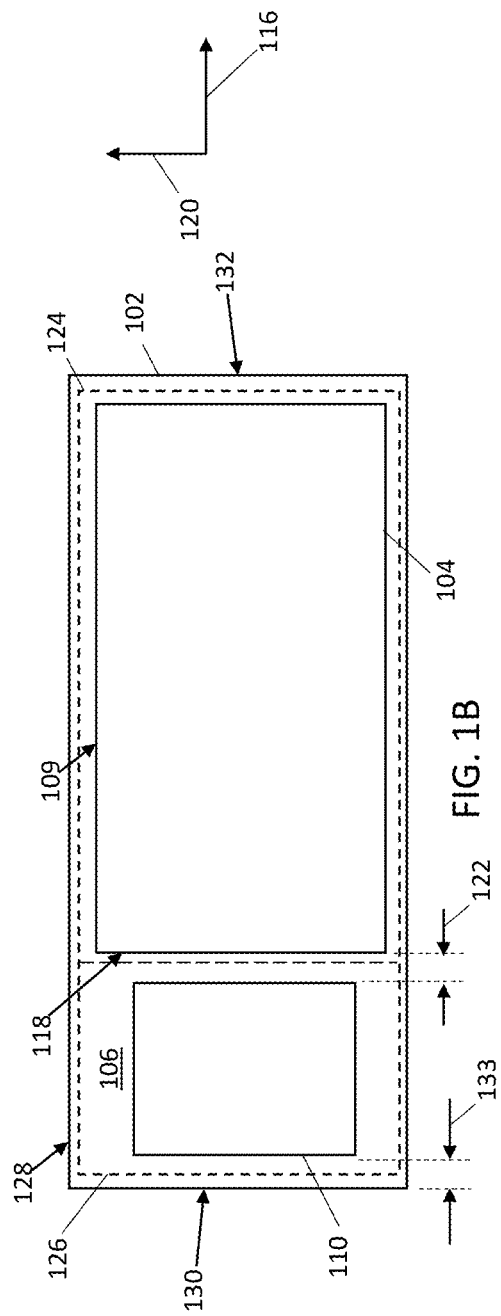
FIG. 1B illustrates the oxide layer within the first portion of the surface of the substrate and the first terminal within the second portion of the surface of the substrate.
Figure 1C:
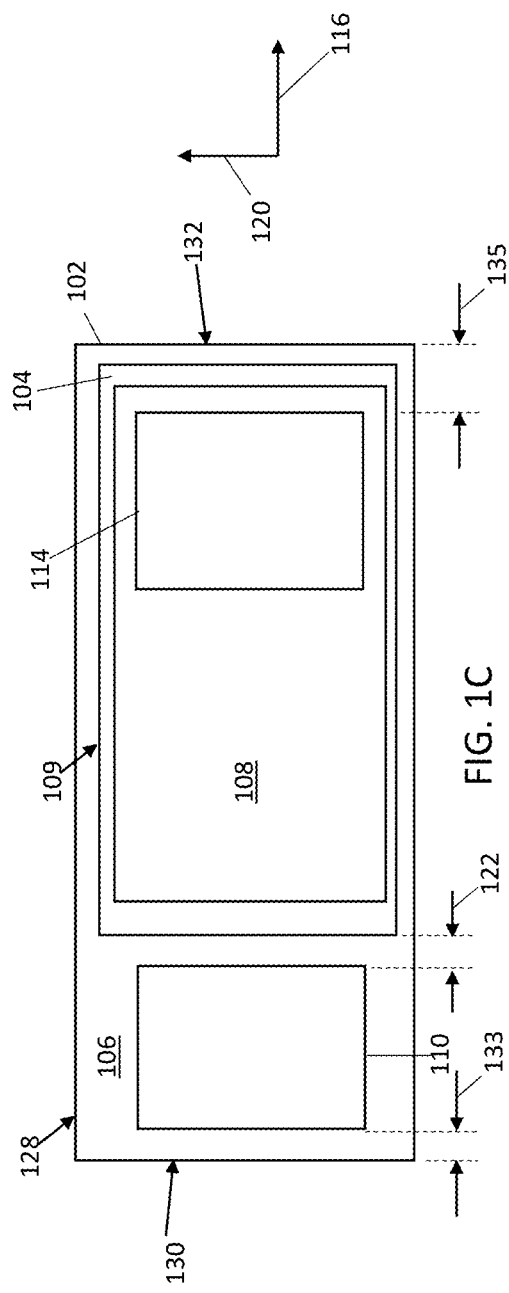
FIG. 1C is a top-down view of the capacitor of FIG. 1A.

Referring to FIG. 1B, the oxide layer 104 can be formed within a first portion 124 of the surface 106 of the substrate 102. The first portion 124 of the surface 106 of the substrate 102 can be distinct from a second portion 126 of the surface 106 of the substrate 102. The second portion 126 of the surface 106 can be free of the oxide layer 104. The first terminal 110 can be connected with the surface 106 of the substrate 102 within the second portion 126 of the surface 106 of the substrate 102. In some embodiments, the first terminal 110 can directly contact the surface 106 of the substrate 102. However, in other embodiments, the first terminal 110 can be electrically connected with the surface 106 of the substrate via one or more suitable conductive layers between the first terminal 110 and the surface 106.

The first terminal 110 can include an electrically conductive material, such as gold, copper, another suitable metal, or other conductive material. The substrate 102 can include a semiconductor material, such as silicon. The oxide layer 104 can include silicon oxide.

The capacitor 100 can be configured for grid array type mounting, such as ball grid array type mounting or land grid array type mounting. The terminals 110, 112 can be exposed along the surface 106 and contained within a perimeter 128 of the surface 106 of the monolithic substrate 202 in an X-Y plane lying in each of the X-direction 120 and the Y-direction 116.

As another example, the substrate 102 can have a pair of end surfaces 130, 132 that are perpendicular to the surface 106 of the monolithic substrate 102. The pair of end surfaces 130, 132 can be free of terminations, including the terminals 110, 112. As a further example, the first terminal 110, the second terminal layer 112, or both can be spaced apart from the pair of opposite end edges 130, 132 of the surface 106 of the monolithic substrate 102 by respective distances 133, 135. The distances 133, 135 can be 10 microns or greater.

Figure 2:
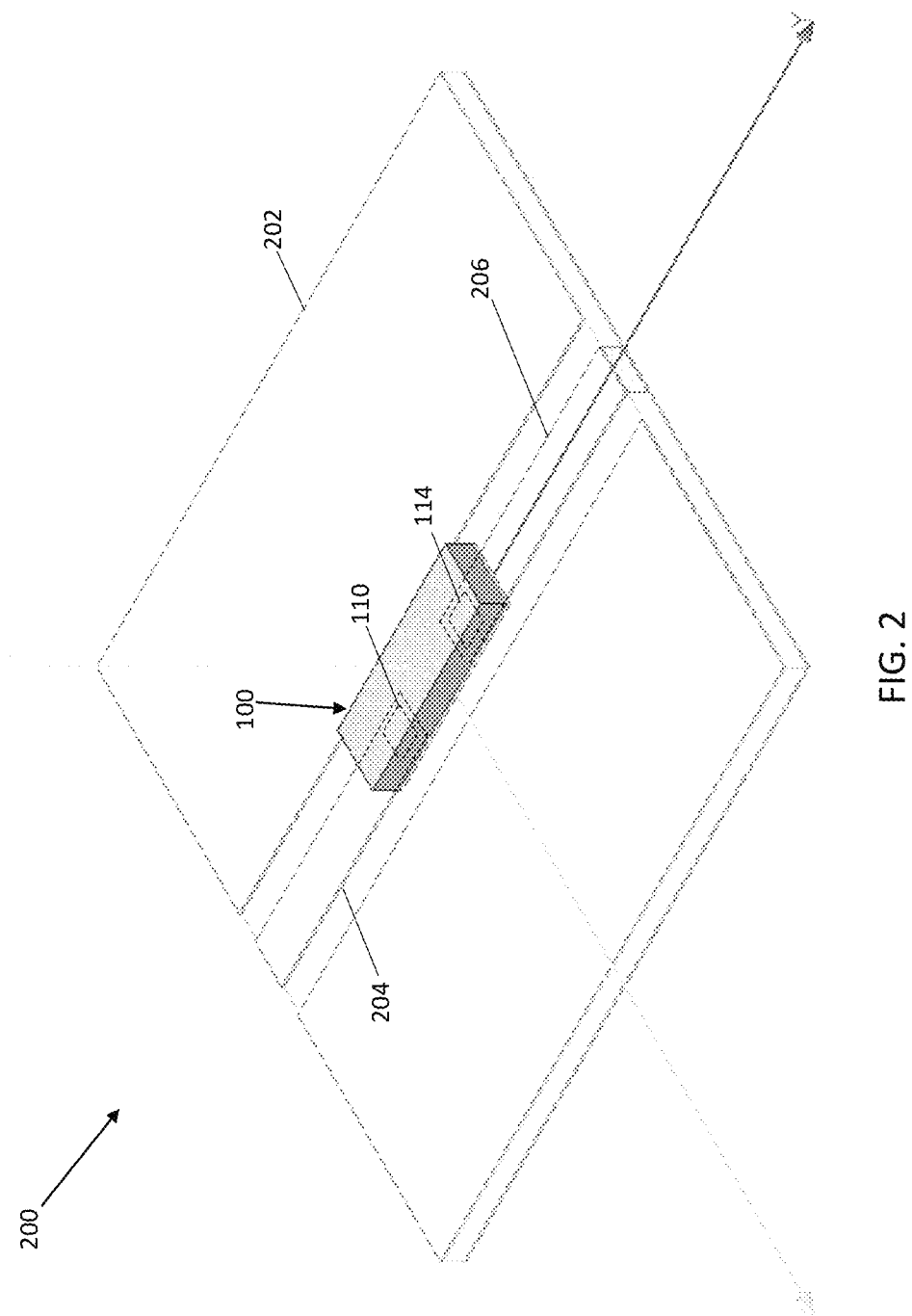
FIG. 2 is a perspective view of a capacitor assembly including the capacitor of FIGS. 1A through 10 and a mounting surface, such as a printed circuit board.

FIG. 2 is a perspective view of a capacitor assembly 200 including the capacitor 100 of FIGS. 1A through 10 and a mounting surface 202, such as a printed circuit board. The first terminal 110 of the capacitor 100 can be connected with a first conductive trace 204 of the mounting surface 202. The second terminal 114 of the capacitor 100 can be connected with a second conductive trace 206 of the mounting surface 202. As shown in FIG. 2, the capacitor 100 can be configured as a flip chip such that the surface 106 (FIGS. 1A-10) is opposite the mounting surface 202.

Figure 3:
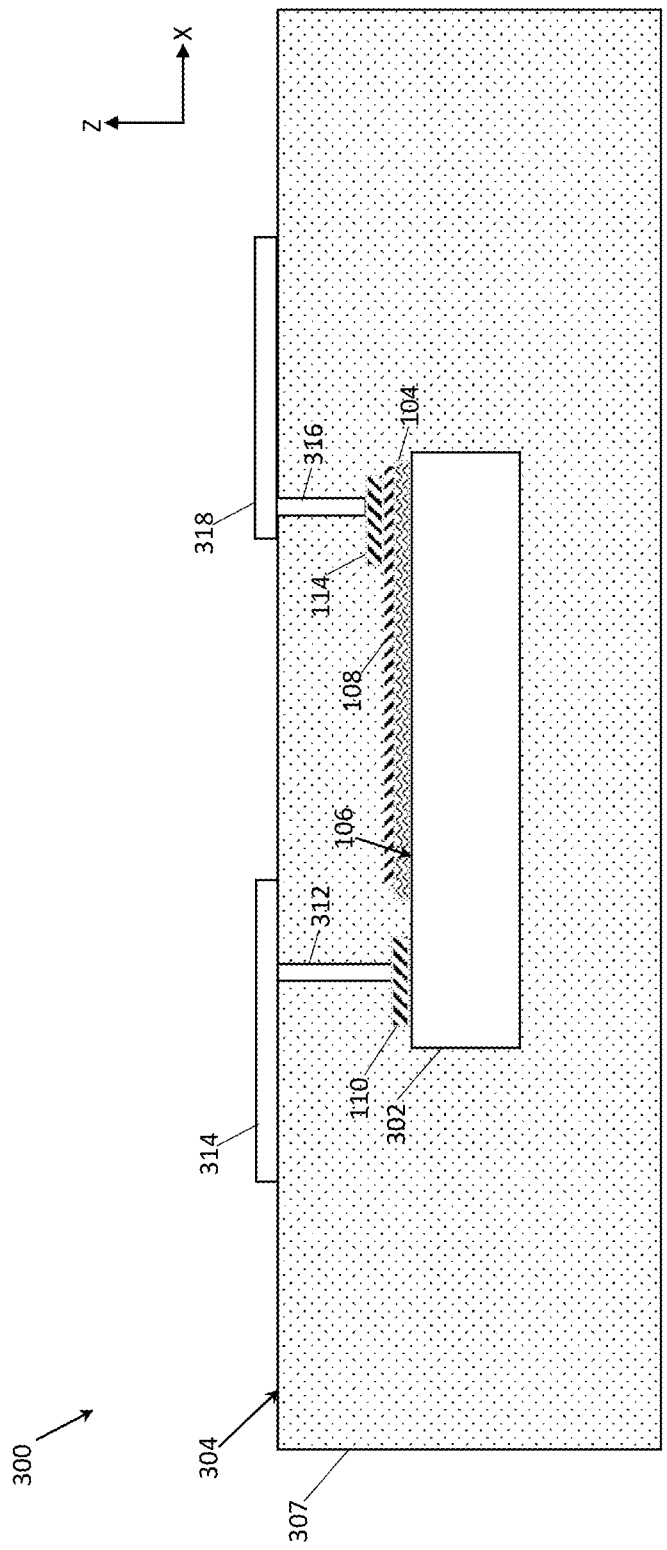
FIG. 3 illustrates a circuit board including a capacitor embedded therein according to aspects of the present disclosure.

FIG. 3 illustrates a circuit board 300 including a capacitor 100 embedded therein according to aspects of the present disclosure. The circuit board 300 can include a circuit board substrate 307 including a mounting surface 304. The capacitor 100 can be at least partially embedded within the circuit board substrate 307 of the circuit board 300. The capacitor 100 can generally be configured similar to the transmission line capacitor 100 of FIGS. 1A through 2.

A first via 312 can extend from the first terminal 110 towards the mounting surface 304 and connect to a first conductive layer 314. The first conductive layer 314 can be formed over the mounting surface 304 and electrically connecting the first terminal 110 with the first conductive layer 314 on the mounting surface 304. A second via 316 can extend from the second terminal 114 towards the mounting surface 304 and connect to a second conductive layer 318. The second conductive layer 318 can be formed over the mounting surface 304 electrically connecting the second terminal 114 with the second conductive layer 318. Alternatively, the vias 112, 116 can extend towards the mounting surface 304 and connect with one or more intermediate layers (e.g., embedded within the circuit board substrate 307), which can in turn be electrically connected the first conductive layer 314 and/or second conductive layer 308. The first via 112 can form at least a portion of an electrical connection between the first terminal 110 and the first conductive layer 314. Similarly, the second via 316 can form at least a portion of an electrical connection between the second terminal 114 and the second conductive layer 318.

As such, the conductive layers 314, 318 can be used to facilitate electrical connections with the capacitor 100. However, it should be understood that, in other embodiments, one or more of the terminals 110, 114 can be exposed along the mounting surface 304. In such an embodiment, the circuit board 300 can be free of one or more of the vias 312, 316.

Figure 4:
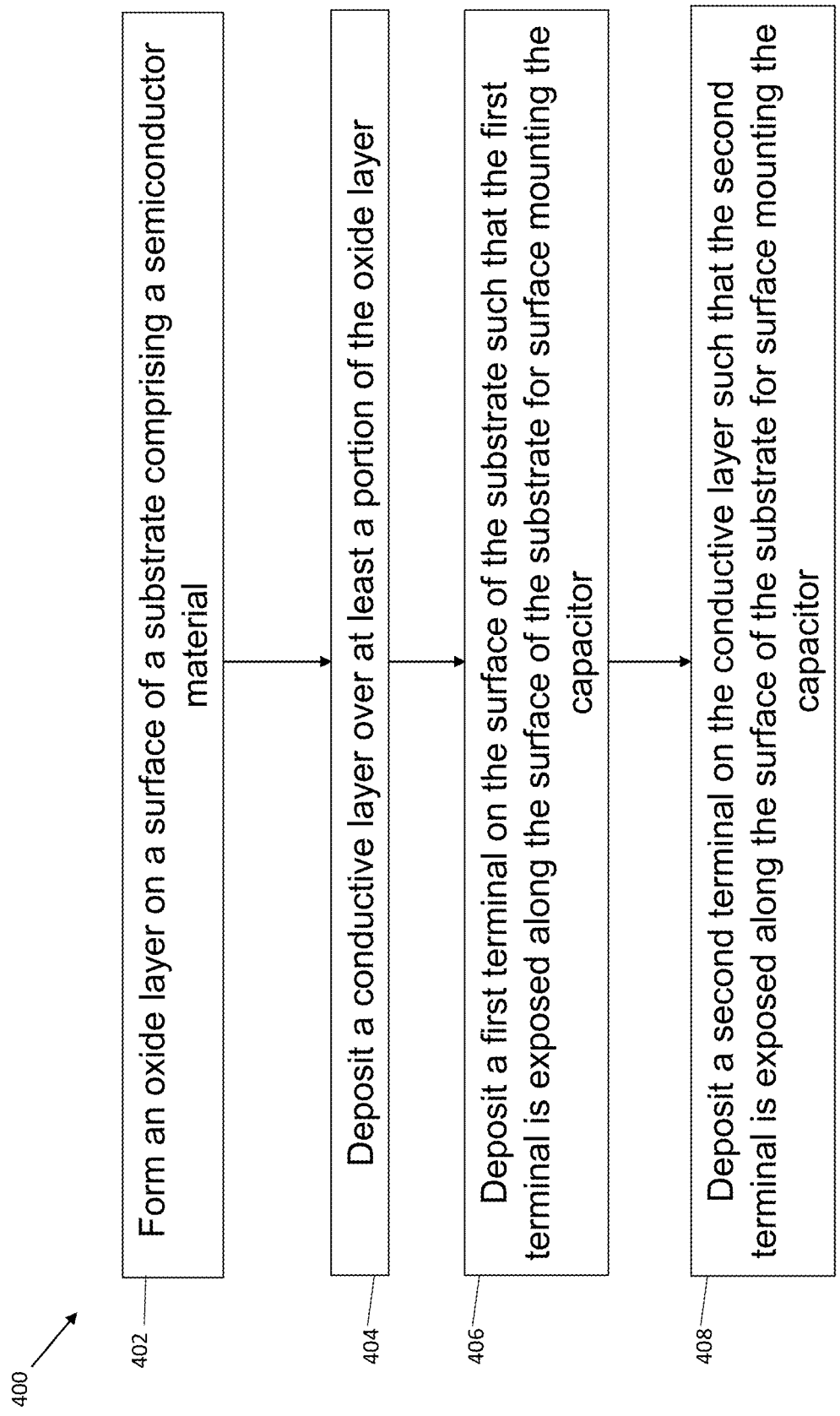
FIG. 4 is a flowchart of a method for forming a capacitor according to aspects of the present disclosure.

Referring to FIG. 4, aspects of the present disclosure are directed to a method 300 for forming a capacitor according to aspects of the present disclosure. In general, the method 400 will be described herein with reference to the capacitor 100 of FIGS. 1A through 10. However, it should be appreciated that the disclosed method 400 may be implemented with any suitable capacitor. In addition, although FIG. 4 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 400 can include, at (402), forming an oxide layer 104 on a surface 106 of a substrate 102 comprising a semiconductor material. For example, the oxide layer 104 can be grown in situ on the substrate 106. Lithography (e.g., photolithography) techniques can be used to define the shape of the oxide layer 104. For instance, portions of the oxide layer 104 can be removed through etching such that the oxide layer 104 is located within the first portion 124 of the surface 106 of the substrate 102.

The method 400 can include, at (404), depositing a conductive layer 108 over at least a portion of the oxide layer 104. The conductive layer 108 can be contained within a perimeter 109 of the oxide layer 104. The conductive layer 108 can be free of direct contact and/or direct electrical connection with the substrate 102.

The method 400 can include, at (406), depositing a first terminal 110 on the surface 106 of the substrate 102 such that the first terminal 110 is exposed along the surface 106 of the substrate 102 for surface mounting the capacitor 100.

The method 400 can include, at (408), depositing a second terminal 114 on the conductive layer 108 such that the second terminal 114 is exposed along the surface 106 of the substrate 102 for surface mounting the capacitor 100.

Figure 5:
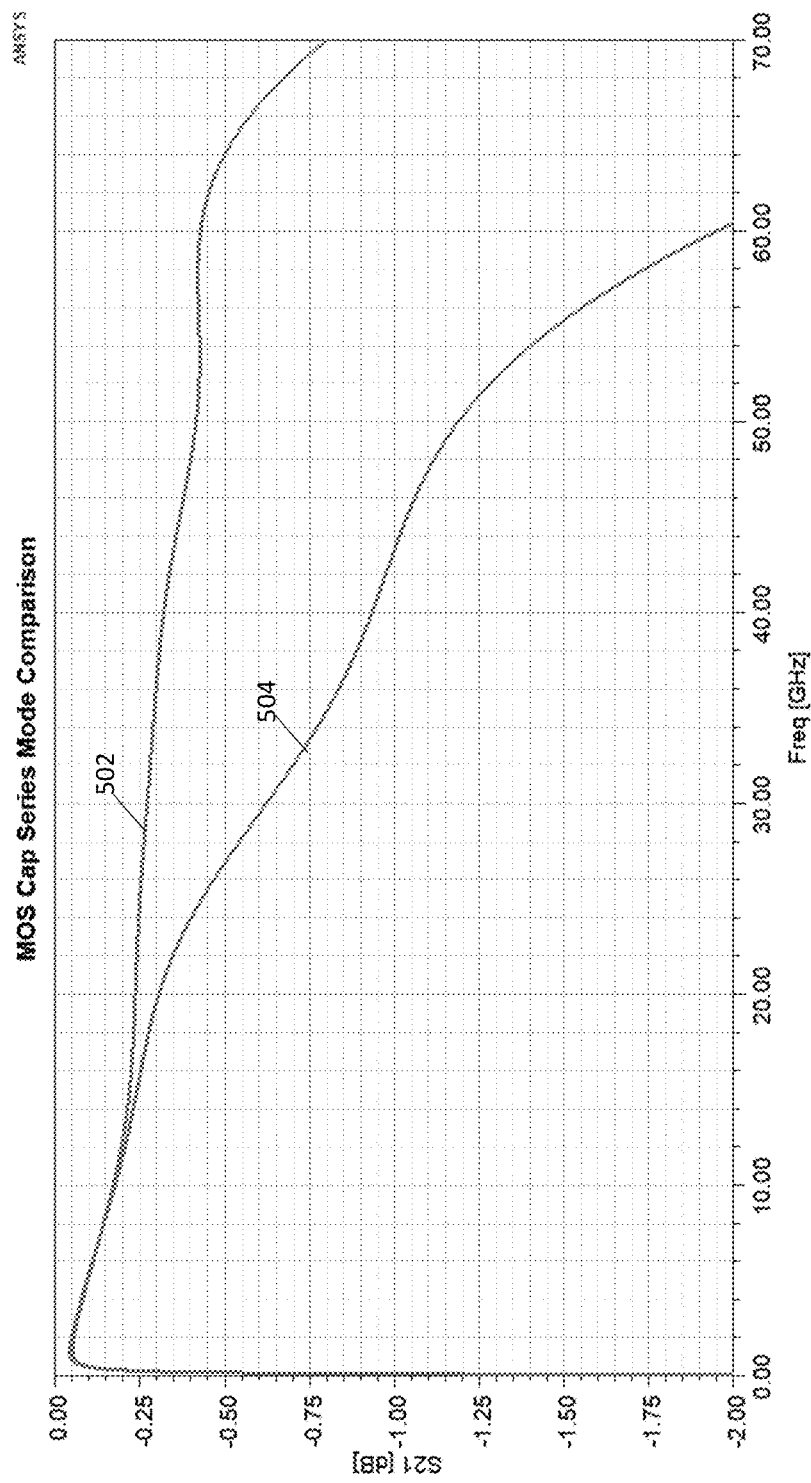
FIG. 5 illustrates a first insertion loss curve for the capacitor of FIGS. 1A through 10 as compared with a second insertion loss curve of a prior art MOS.

FIG. 5 illustrates a first insertion loss curve 502 for the capacitor 100 of FIGS. 1A through 1O as compared with a second insertion loss curve 504 of a prior art MOS capacitor. The prior art capacitor can include an oxide layer formed on a surface of a substrate. The prior art capacitor can be arranged on a mounting surface such that the oxide layer is exposed along a top surface of the prior art capacitor. One or more wirebond connections can connect the oxide layer with a first conductive trace of the mounting surface. The substrate can contact and electrically connect a second conductive trace of the mounting surface.

The insertion loss curves 502, 504 were generated using computer modeling of the capacitor 100 and the prior art capacitor for insertion loss at the second terminal 114 for an input signal applied to the first terminal 110. For the prior art capacitor, the second insertion loss curve 504 represents an insertion loss at the second conductive trace for an input signal applied to the first conductive trace of the mounting surface. The second insertion loss curve 504 represent an insertion loss of the capacitor 100 of the capacitor assembly 200 of FIG. 2 at the second conductive trace 206 for an input signal applied to the first conductive trace 204.

The insertion loss curve 502 is greater than −1 dB for frequencies ranging from about 5 GHz to about 70 GHz, and greater than about −0.5 dB for frequencies ranging from about 5 GHz to about 60 GHz, and greater than −0.35 dB for frequencies ranging from about 5 GHz to 40 GHz, and greater than −0.30 dB for frequencies ranging from about 5 GHz to 30 GHz.

Test Methods

The following section provides example methods for testing an insertion loss response curve of a capacitor according to aspects of the present disclosure. The insertion loss response curves of the capacitors may be measured using a Keithley 2400 series Source Measure Unit (SMU), for example, a Keithley 2410-C SMU These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

Applications

The capacitor described herein is useful in a variety of applications. The capacitor may be particularly useful in devices that process wideband radiofrequency signals, as the capacitor exhibits excellent performance at high frequencies, such as frequencies of 20 GHz or higher. Example devices include mobile devices (e.g., cell phones, tables etc.), cell phone towers, Receiver Optical Sub Assemblies (ROSA), Transmission Optical Sub Assembly (TOSA), and other RF communication devices. Such devices may be particularly useful in military and space applications.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A capacitor comprising:
a substrate comprising a semiconductor material;
an oxide layer formed on a surface of the substrate;
a conductive layer formed over at least a portion of the oxide layer;
a first terminal connected with the surface of the substrate; and
a second terminal connected with the conductive layer, wherein the oxide layer is connected in series between the substrate and the conductive layer to form the capacitor between the first terminal and the second terminal;
wherein:
each of the first terminal and the second terminal are exposed along the surface of the substrate for surface mounting the capacitor, the first terminal being coplanar with the oxide layer;
the first terminal is spaced apart from the second terminal in a Y-direction;
the oxide layer has an edge aligned with an X-direction that is perpendicular to the Y-direction;
the edge of the oxide layer defines an end of the oxide layer and is spaced apart from an end of substrate in the Y-direction such that the end of the oxide layer is spaced apart from the end of the substrate in the Y-direction;
the first terminal is located between the edge of the oxide layer and the end of the substrate in the Y-direction;
the substrate comprises a first end surface and a second end surface that are perpendicular to the surface of substrate and that are spaced apart from one another along the Y-direction; and
the first terminal is disposed adjacent to the first end surface and the second terminal is disposed adjacent to the second end surface.

2. The capacitor of claim 1, wherein the first terminal is connected with the surface of the substrate at a location that is spaced apart from the oxide layer along the surface of the substrate.

3. The capacitor of claim 1, wherein:
the oxide layer covers a first portion of the surface of the substrate that is distinct from a second portion of the surface of the substrate that is free of the oxide layer; and
the first terminal is connected with the surface of the substrate within the second portion of the surface of the substrate.

4. The capacitor of claim 1, wherein the first terminal comprises an electrically conductive material deposited as a thin-film layer directly on the surface of the substrate.

5. The capacitor of claim 1, wherein the semiconductor material of the substrate comprises silicon.

6. The capacitor of claim 1, wherein the oxide layer comprises silicon oxide.

7. The capacitor of claim 1, wherein the capacitor exhibits an insertion loss at the second terminal and for an input signal applied to the first terminal, the insertion loss being greater than about −0.75 dB for frequencies ranging from about 5 GHz to about 40 GHz.

8. The capacitor of claim 1, wherein the capacitor exhibits an insertion loss at the second terminal and for an input signal applied to the first terminal, the insertion loss being greater than about −2 dB for frequencies ranging from about 5 GHz to about 60 GHz.

9. A capacitor comprising:
a substrate comprising a semiconductor material;
an oxide layer formed on a surface of the substrate;
a conductive layer formed over the oxide layer;
the conductive layer contained within a perimeter of the oxide layer;
a first terminal formed on the surface of the substrate, the first terminal co-planar with the oxide layer; and
a second terminal connected with the oxide layer, wherein the oxide layer is connected in series between the substrate and the conductive layer to form the capacitor between the first terminal and the second terminal;
wherein the capacitor exhibits an insertion loss at the second terminal and for an input signal applied to the first terminal, the insertion loss being greater than about −0.75 dB for frequencies ranging from about 5 GHz to about 40 GHZ,
wherein the substrate comprises a first end surface and a second end surface that are perpendicular to the surface of substrate and that are spaced apart from one another along a Y-direction, and
wherein the first terminal is disposed adjacent to the first end surface and the second terminal is disposed adjacent to the second end surface.

10. The capacitor of claim 9, wherein the first terminal is connected with the surface of the substrate at a location that is spaced apart from the oxide layer along the surface of the substrate.

11. The capacitor of claim 9, wherein:
the first terminal is spaced apart from the second terminal in a Y-direction;
the oxide layer has an edge aligned with an X-direction that is perpendicular to the Y-direction, the edge of the oxide layer being spaced apart from an end of substrate in the Y-direction; and
the first terminal is located between the edge of the oxide layer and the end of the substrate in the Y-direction.

12. The capacitor of claim 9, wherein:
the oxide layer covers a first portion of the surface of the substrate that is distinct from a second portion of the surface of the substrate that is free of the oxide layer; and
the first terminal is connected with the surface of the substrate within the second portion of the surface of the substrate.

13. The capacitor of claim 9, wherein the first terminal comprises an electrically conductive material that directly contacts the surface of the substrate.

14. The capacitor of claim 9, wherein the semiconductor material of the substrate comprises silicon.

15. The capacitor of claim 9, wherein the oxide layer comprises silicon oxide.

16. The capacitor of claim 9, wherein the capacitor exhibits an insertion loss at the second terminal and for an input signal applied to the first terminal, the insertion loss being greater than about −2 dB for frequencies ranging from about 5 GHz to about 60 GHz.

17. A method of forming a capacitor comprising:
forming an oxide layer on a surface of a substrate comprising a semiconductor material;
depositing a conductive layer over the oxide layer such that the conductive layer is contained within a perimeter of the oxide layer;
depositing a first terminal on the surface of the substrate such that the first terminal is co-planar with the oxide layer and is exposed along the surface of the substrate for surface mounting the capacitor; and
depositing a second terminal on the conductive layer such that the second terminal is exposed along the surface of the substrate for surface mounting the capacitor,
wherein the substrate comprises a first end surface and a second end surface that are perpendicular to the surface of substrate and that are spaced apart from one another along a Y-direction, and
wherein the first terminal is disposed adjacent to the first end surface and the second terminal is disposed adjacent to the second end surface.

18. The method of claim 17, wherein
forming the oxide layer on the surface of the substrate comprises forming the oxide layer within a first portion of the surface of the substrate that is distinct from a second portion of the surface of the substrate that is free of the oxide layer; and
depositing the first terminal comprises depositing the first terminal within the second portion of the surface of the substrate.

19. A circuit board comprising:
a circuit board substrate having a mounting surface;
a capacitor at least partially embedded within the circuit board substrate, the capacitor comprising:
a substrate comprising a semiconductor material;
an oxide layer formed on a surface of the substrate;
a conductive layer formed over at least a portion of the oxide layer;
a first terminal connected with the surface of the substrate; and
a second terminal connected with the conductive layer, wherein the oxide layer is connected in series between the substrate and the conductive layer to form the capacitor between the first terminal and the second terminal; and
at least one via connected with the one of the first terminal or the second terminal, the at least one via extending towards the mounting surface of the circuit board substrate,
wherein:
each of the first terminal and the second terminal are exposed along the surface of the substrate for surface mounting the capacitor, the first terminal being co-planar with the oxide layer;
the first terminal is spaced apart from the second terminal in an X-direction;
the oxide layer has an edge aligned with an Y-direction that is perpendicular to the X-direction;
the edge of the oxide layer defines an end of the oxide layer and is spaced apart from an end of substrate in the X-direction such that the end of the oxide layer is spaced apart from the end of the substrate in the X-direction;
the first terminal is located between the edge of the oxide layer and the end of the substrate in the X-direction;
the substrate comprises a first end surface and a second end surface that are perpendicular to the surface of substrate and that are spaced apart from one another along the X-direction; and the first terminal is disposed adjacent to the first end surface and the second terminal is disposed adjacent to the second end surface.

\* \* \* \* \*